US012713793B2

(12) United States Patent
Kim et al.

(10) Patent No.: US 12,713,793 B2
(45) Date of Patent: Aug. 18, 2026

(54) DISPLAY DEVICE

(71) Applicant: Samsung Display Co., LTD., Yongin-si (KR)

(72) Inventors: Jae Ik Kim, Yongin-si (KR); Hye Jin Gwark, Yongin-si (KR); Hwi Kim, Yongin-si (KR); Jungsun Park, Yongin-si (KR); Yeon Hwa Lee, Yongin-si (KR); Joon Gu Lee, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 379 days.

(21) Appl. No.: 18/435,431

(22) Filed: Feb. 7, 2024

(65) Prior Publication Data

US 2024/0276805 A1 Aug. 15, 2024

(30) Foreign Application Priority Data

Feb. 13, 2023 (KR) ........................ 10-2023-0018711

(51) Int. Cl.
*H10K 59/131* (2023.01)

(52) U.S. Cl.
CPC .................................. *H10K 59/131* (2023.02)

(58) Field of Classification Search
CPC ...... H10H 29/49; H10K 59/82; H10K 59/805; H10K 59/131; H10K 59/1315
See application file for complete search history.

(56) References Cited

U.S. PATENT DOCUMENTS 11,276,738 B2 * 3/2022 Choi .................... H10K 59/124
2006/0050192 A1 * 3/2006 Cho .................. G02F 1/136286 349/42
2010/0097295 A1 4/2010 Kwak
2016/0043341 A1 * 2/2016 Heo ................... H10K 59/1315 438/23
2016/0276619 A1 9/2016 Cheng et al.
2019/0131365 A1 * 5/2019 Jung .................. H10K 59/8722
2019/0172898 A1 * 6/2019 Choi .................... H10K 59/122
2019/0334125 A1 * 10/2019 Hosono .............. H10K 59/1315
2020/0135838 A1 * 4/2020 Han ................... H10K 59/1315
(Continued)

FOREIGN PATENT DOCUMENTS

KR 1020160006110 1/2016
KR 1020160006520 A 1/2016
KR 1020170050171 5/2017

*Primary Examiner* — Evren Seven

(74) *Attorney, Agent, or Firm* — CANTOR COLBURN LLP

(57) ABSTRACT

A display device includes: a substrate including a display area and a non-display area; an external common voltage line disposed in the non-display area; a common voltage line disposed in the display area and connected to the external common voltage line; a plurality of pixels positioned in the display area, each of which includes a first electrode and an emission layer; and a second electrode positioned on the pixels. The common voltage line has a multi-layered structure including a first layer, a second layer, and a third layer, the second layer defines an undercut structure therein, a width of the second layer is narrower than a width of each of the first layer and the third layer, and a length of an undercut of the undercut structure is greater than a thickness of the common voltage line.

20 Claims, 19 Drawing Sheets

(56) References Cited

U.S. PATENT DOCUMENTS

| | | | | |
|---|---|---|---|---|
| 2020/0335025 | A1 | 10/2020 | Kim et al. | |
| 2021/0036073 | A1* | 2/2021 | Cho | H10K 59/124 |
| 2021/0202675 | A1* | 7/2021 | Jang | H10W 90/00 |
| 2022/0005877 | A1* | 1/2022 | Seo | H10K 59/8731 |
| 2022/0052137 | A1* | 2/2022 | Song | H10K 59/873 |
| 2022/0209209 | A1* | 6/2022 | Son | H10K 59/124 |
| 2023/0189589 | A1* | 6/2023 | Jeon | H10K 59/131 257/40 |
| 2023/0207735 | A1* | 6/2023 | Choi | H10K 59/1315 257/79 |
| 2023/0282790 | A1* | 9/2023 | Nam | H10H 20/857 |
| 2023/0422579 | A1* | 12/2023 | Lee | H10K 59/131 |
| 2024/0251635 | A1* | 7/2024 | Tang | H10K 59/1201 |
| 2024/0266489 | A1* | 8/2024 | Lee | H10H 20/857 |

* cited by examiner

DISPLAY DEVICE

This application claims priority to Korean Patent Application No. 10-2023-0018711, filed on Feb. 13, 2023, and all the benefits accruing therefrom under 35 U.S.C. § 119, the content of which in its entirety is herein incorporated by reference.

BACKGROUND

(a) Field of the Invention

The present disclosure relates to a display device.

(b) Description of the Related Art

A display device is a device that displays an image, and an emissive display device has recently been in the spotlight as a self-emissive display device.

An emissive display device has a self-emissive characteristic, eliminating the necessity for a light source, unlike a liquid crystal display ("LCD") device, and thus can be fabricated to be thinner and lighter. Further, the emissive display device has high quality characteristics such as low power consumption, high luminance, high response speed, and the like.

In general, the emissive display device includes a substrate, a plurality of thin film transistors positioned on the substrate, a plurality of insulating layers disposed between wires constituting the thin film transistors, and light emitting devices connected to the thin film transistors.

The light emitting diodes may each include a first electrode, an emission layer, and a second electrode, and the second electrode may be positioned to have a plate shape throughout the display device.

SUMMARY

Embodiments have been made in an effort to provide a display device capable of improving a contact character between an electrode and a wire and preventing a voltage drop.

An embodiment of the present disclosure provides a display device including: a substrate including a display area and a non-display area; an external common voltage line disposed in the non-display area; a common voltage line disposed in the display area and connected to the external common voltage line; a plurality of pixels positioned in the display area, each of which includes a first electrode and an emission layer; and a second electrode positioned on the pixels, where the common voltage line has a multi-layered structure including a first layer, a second layer, and a third layer, the second layer defines an undercut structure therein, a width of the second layer is narrower than a width of each of the first layer and the third layer, and a length of an undercut of the undercut structure is greater than a thickness of the common voltage line.

The length of the undercut may be about 5% to about 90% of a width of the common voltage line.

The second layer of the common voltage line may include a material that is different from a material of the first layer and the third layer.

The first layer of the common voltage line may be positioned closer to the substrate than the third layer, and the common voltage line and the second electrode may directly contact each other on an upper surface of the first layer.

It may further include an organic layer disposed between the common voltage line and the second electrode.

The organic layer may be disposed between the third layer of the common voltage line and the second electrode.

An edge region of the second electrode may be directly disposed on the upper surface of the first layer of the common voltage line.

The display device may further include a source electrode and a drain electrode positioned in the display area, and the common voltage line may be positioned in the same layer as a layer of the source electrode and the drain electrode.

The display device may further include: an insulating layer disposed on the common voltage line, and the insulating layer may define an opening therein overlapping the undercut.

A shape of the opening may be a quadrangle or a circle in a plan view.

The third layer of the common voltage line may include a side protruding into an area where the undercut is positioned in the plan view.

The third layer of the common voltage line may include a portion protruding on a side opposite to a side where the undercut is positioned in the plan view.

The third layer of the common voltage line may include a side protruding to an area where the undercut is positioned and an opposite side protruding to where the undercut is not positioned in the plan view.

A width of the common voltage line in an area where the undercut of the second layer is positioned may be narrower than a width of the common voltage line in an area where the undercut is not positioned.

The undercut structure may be defined on one side of the common voltage line.

The undercut structure may be defined at opposite sides of the common voltage line.

The undercut structure may be defined in a zigzag pattern at the opposite sides of the common voltage line.

The length of the undercut may be longer than half of a width of the third layer of the common voltage line.

The undercut structure, which is positioned on a first side surface of the common voltage line, and the undercut structure, positioned on a second side surface of the common voltage line, may not meet each other.

The second electrode may contact the external common voltage line in the non-display area.

According to the embodiments, it is possible to provide a display device capable of improving a contact character between an electrode and a wire and preventing a voltage drop.

DETAILED DESCRIPTION

Figure 1:
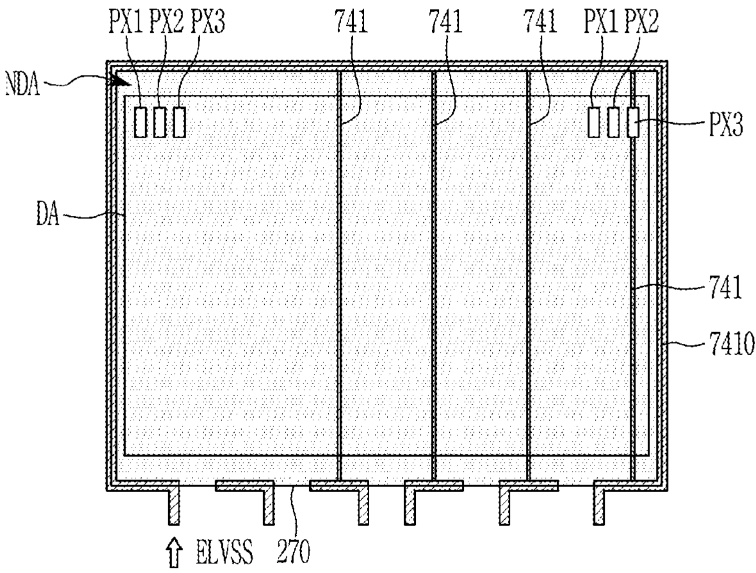
FIG. 1 schematically illustrates a display device according to an embodiment.
Figure 1:
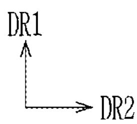

The present invention will be described more fully hereinafter with reference to the accompanying drawings, in which embodiments of the invention are shown. As those skilled in the art would realize, the described embodiments may be modified in various different ways, all without departing from the spirit or scope of the present invention.

To clearly describe the present invention, parts that are irrelevant to the description are omitted, and like numerals refer to like or similar constituent elements throughout the specification.

Further, since sizes and thicknesses of constituent members shown in the accompanying drawings are arbitrarily given for better understanding and ease of description, the present invention is not limited to the illustrated sizes and thicknesses. In the drawings, the thicknesses of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, throughout the specification, the phrase "in a plan view" means when an object portion is viewed from above, and the phrase "in a cross-sectional view" means when a cross-section taken by vertically cutting an object portion is viewed from the side.

As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Hereinafter, a display device according to an exemplary embodiment of the present invention will be described in detail with reference to drawings.

FIG. 1 schematically illustrates a display device according to an embodiment. Referring to FIG. 1, the display device according to an embodiment includes a display area DA and a non-display area NDA. A plurality of pixels PX1, PX2, and PX3 are positioned in the display area DA. In FIG. 1, only some pixels are briefly displayed for convenience of description. Each of the pixels PX may include a transistor and a light emitting device connected thereto. The light emitting device includes a first electrode, an emission layer, and a second electrode, and the second electrode 270 is illustrated in FIG. 1 for convenience of description. A detailed structure of the pixel PX of the display area and the light emitting device will be separately described later with reference to FIG. 19.

An external common voltage line 7410 is positioned in the non-display area NDA. The external common voltage line 7410 may surround the display area DA. The external common voltage lines 7410 may be spaced apart from each other at one side of the display area DA. The external common voltage line 7410 may transfer a common voltage ELVSS to the second electrode 270 of the pixel PX.

A common voltage line 741 connected to the external common voltage line 7410 is positioned in the display area DA. The common voltage line 741 may be connected to the external common voltage line 7410 while being positioned along the first direction DR1. The common voltage line 741 may be positioned on the same layer as the source and drain electrodes of the display area DA.

As such, when the external common voltage line 7410 is connected to the common voltage line 741, it is possible to solve a problem in which a voltage decreases during a transfer process of the common voltage ELVSS. That is, when the external common voltage line 7410 is positioned to surround an edge of the display area DA, a voltage decrease may occur while the common voltage ELVSS is transferred along the external common voltage line 7410. However, when the common voltage line 741 positioned in the display area DA is connected to the external common voltage line 7410, the voltage transfer path may be shortened, thereby preventing reduction of the common voltage. This common voltage is transferred to the second electrode 270.

Although not illustrated in FIG. 1, a driving voltage line for transferring a driving voltage may be further included. An external driving voltage line may be positioned in the non-display area NDA, and the driving voltage line positioned in the display area DA may be connected to an external driving voltage line positioned in the non-display area NDA. A driving voltage may be transferred to each pixel of the display device through the driving voltage line.

Referring to FIG. 1, the second electrode 270 is positioned. The second electrode 270 may be positioned in both the display area DA and the non-display area NDA. The second electrode 270 may contact the external common voltage line 7410 in the non-display area NDA to receive the common voltage ELVSS. In FIG. 1, the external common voltage line 7410 and the second electrode 270 may contact each other in an area where the external common voltage line 7410 and the second electrode 270 overlap, and a common voltage may be transferred to the second electrode 270.

In addition, the second electrode 270 may contact the common voltage line 741 in the display area DA to receive the common voltage ELVSS. As such, the second electrode 270 may receive the common voltage in the display area DA and the non-display area NDA, and thus during the voltage transfer process, a voltage drop may be minimized and the common voltage may be well transferred to the second electrode 270.

The present disclosure relates to a method for contacting the common voltage line 741 and the second electrode 270 in the display area DA.

Although only a portion of the common voltage line 741 is illustrated in FIG. 1, various numbers of common voltage lines 741 may be positioned according to another embodiment. As illustrated in FIG. 1, the common voltage line 741 and the second electrode 270 may contact each other only in some pixels, or in each pixel, the common voltage line 741 and the second electrode 270 may contact each other. However, a space may be required in the display device to allow the common voltage line 741 and the second electrode 270 to contact each other, and thus the common voltage line 741 and the second electrode 270 may contact each other only in some pixels. For example, the common voltage line 741 and the second electrode 270 may contact each other every six pixels. However, this is an example, and the present disclosure is not limited thereto.

Figure 2:
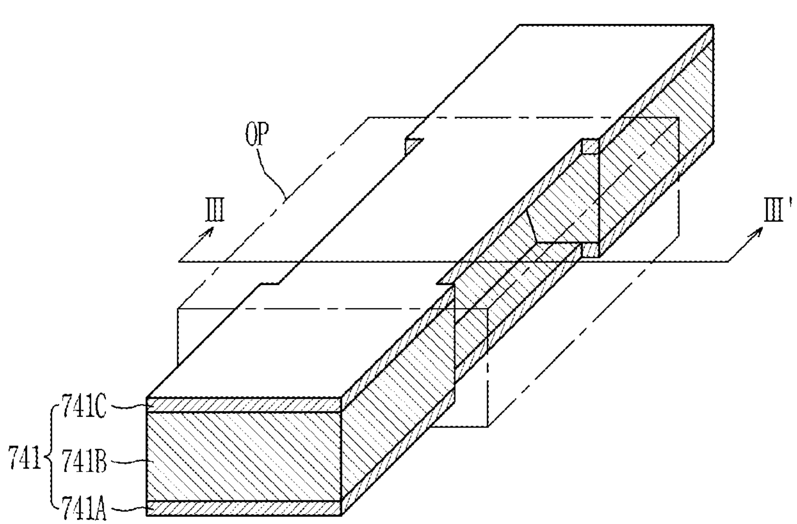
FIG. 2 illustrates a configuration of a common voltage line positioned within a display area in a display device according to an embodiment.

FIG. 2 illustrates a configuration of the common voltage line 741 positioned within the display area DA in the display device according to an embodiment. As illustrated in FIG. 2, the common voltage line 741 may have a three-layer structure including a first layer 741A, a second layer 741B, and a third layer 741C. In a multilayer structure of the display device, an insulating layer is disposed on the common voltage line 741, and an opening OP may be defined in the insulating layer to allow the common voltage line 741 and the second electrode 270 to contact each other. In FIG. 2, a portion where the opening OP is formed is indicated by a dotted line. In the process of forming the opening OP, the common voltage line 741 may be etched. Accordingly, the common voltage line 741 may not be covered by the insulating layer and may be exposed in an area where the opening OP is formed, and may contact the second electrode 270.

The common voltage line 741 may have a multi-layered structure. In other words, the common voltage line 741 may include a first layer 741A, a second layer 741B, and a third layer 741C including different materials from each other, and an etching characteristic of each layer may be different. In this case, the second layer 741B may be etched more than other layers, and the common voltage line 741 and the second electrode 270 may contact each other in the second layer 741B.

Figure 3:
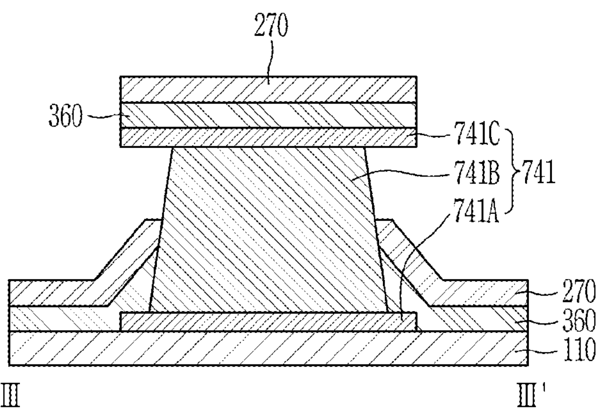
FIG. 3 illustrates a cross-sectional view taken along line III-III' of FIG. 2.

FIG. 3 illustrates a cross-sectional view taken along line III-III' of FIG. 2, and shows a configuration in which the common voltage line 741 and the second electrode 270 contact each other in an embodiment. As illustrated in FIG. 3, the common voltage line 741 may have an undercut structure in which the second layer 741B is more etched than the other layers of the common voltage line 741. A substrate 110 may be disposed under the common voltage line 741.

In an embodiment, an organic layer 360 may be disposed between an upper surface of the common voltage line 741 and the second electrode 270. The organic layer 360 may be an emission layer. According to a manufacturing process, the organic layer 360 is disposed between the second electrode 270 and the common voltage line 741, and thus it may be difficult for the second electrode 270 to directly contact the upper surface of the common voltage line 741, i.e., the upper surface of the third layer 741C. In order for the second electrode 270 to directly contact the upper surface of the common voltage line 741, a process of removing the organic layer 360 using a separate mask is required, which reduces process efficiency.

Accordingly, as illustrated in FIG. 3, the second electrode 270 comes into contact with the common voltage line 741 from side surfaces. As illustrated in FIG. 3, since a side surface of the second electrode 270 and a side surface of the common voltage line 741 contact each other, a contact area between the second electrode 270 and the common voltage line 741 is not sufficient.

Figure 4:
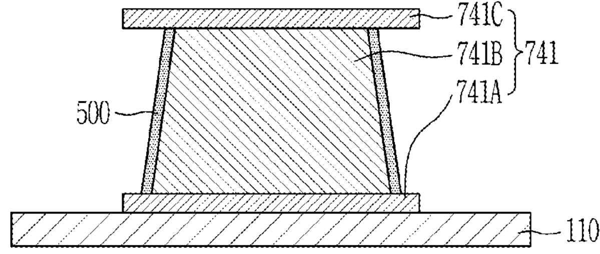
FIG. 4 illustrates a common voltage line having an oxide film positioned on a side surface.

In addition, an oxide layer may be disposed on the side surface of the common voltage line 741 having an undercut structure. FIG. 4 illustrates a common voltage line 741 having an oxide layer 500 disposed on the side surface thereof. As illustrated in FIG. 4, when the oxide layer 500 is disposed on the side surface, resistance may increase upon contact with the second electrode 270.

Figure 5:
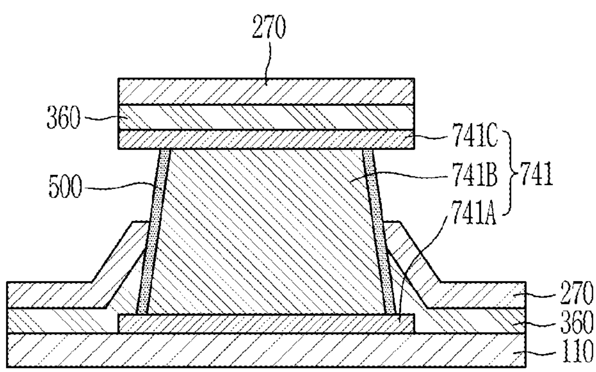
FIG. 5 illustrates a configuration in which a common voltage line having an oxide film positioned on a side surface is in contact with a second electrode.

FIG. 5 illustrates a configuration in which the common voltage line 741 having the oxide layer 500 disposed on the side surface and the second electrode 270 are in contact. As illustrated in FIG. 5, the common voltage line 741 and the second electrode 270 do not directly contact each other, and the oxide layer 500 is positioned therebetween. In this case, since a contact area between the common voltage line 741 and the second electrode 270 is narrow and even the oxide layer 500 is disposed therebetween, a common voltage may not be transferred to the second electrode 270 well.

However, in the display device according to the present embodiment, the undercut structure of the common voltage line 741 is deeply formed so that the common voltage line 741 and the second electrode 270 come into contact with each other not from the side surface but from the upper surface. That is, since the second electrode 270 contacts the upper surface of the first layer 741A rather than the side of the second layer 741B of the common voltage line 741, the contact area is widened, and even when the oxide layer 500 is disposed on the side surface of the second layer 741B, a contact characteristic may not be affected.

Figure 6:
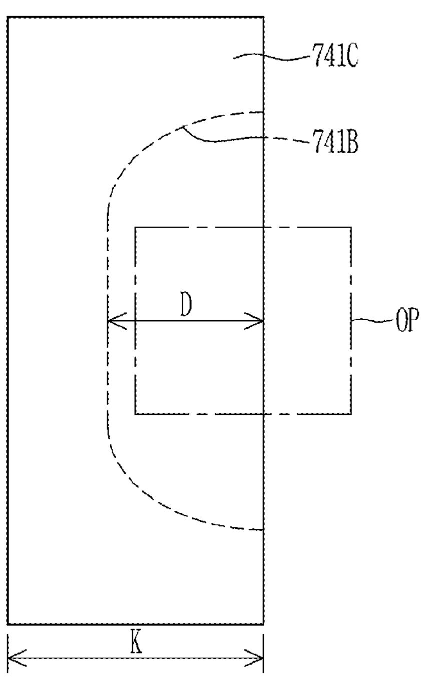
FIG. 6 illustrates a plan view of an upper surface of a common voltage line.
Figure 7:
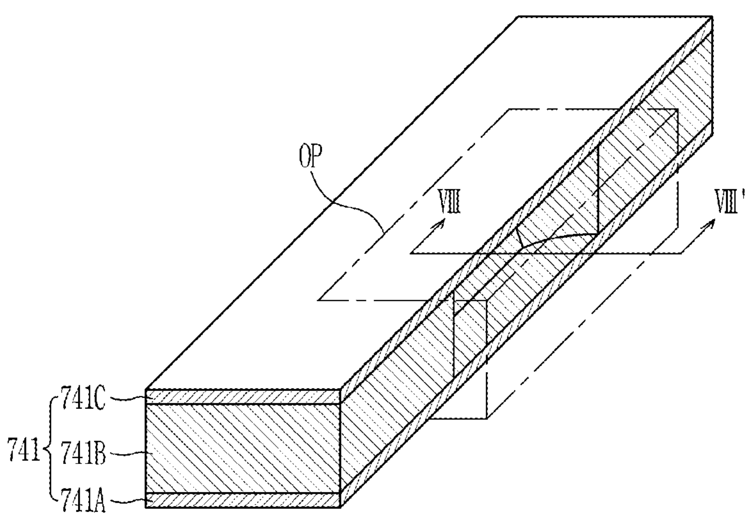
FIG. 7 illustrates the common voltage line of FIG. 6 from another angle.

FIG. 6 to FIG. 7 each illustrate a shape of the common voltage line 741 according to an embodiment. As illustrated in FIG. 7, the common voltage line 741 may have a three-layer structure including a first layer 741A, a second layer 741B, and a third layer 741C. In this case, the first layer 741A, the second layer 741B, and the third layer 741C may each include one or more of Al, Cu, Ti, and an alloy thereof. The second layer 741B may include a material different from the material of the first layer 741A and the third layer 741C. The second layer 741B may include a material that is more easily etched than the material of the first layer 741A and the third layer 741C.

Figure 8:
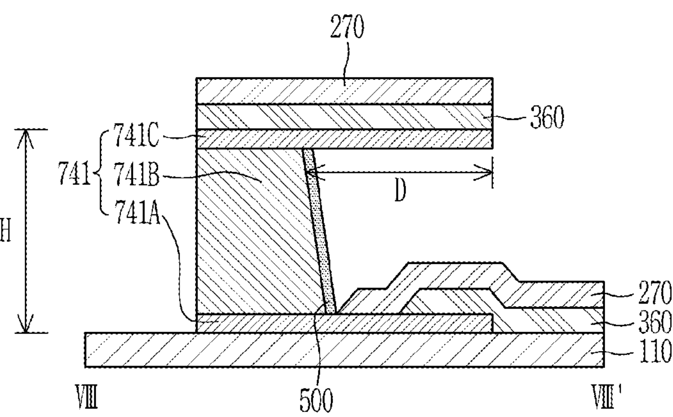
FIG. 8 illustrates a contact between a common voltage line and a second electrode with respect to a cross-section taken along line VIII-VIII' of FIG. 7.

FIG. 8 illustrates a contact between the common voltage line 741 and the second electrode 270 in a cross-section cut along line VIII-VIII' of FIG. 7.

FIG. 6 illustrates a plan view of the upper surface of the common voltage line 741, specifically the third layer 741C. In FIG. 6, the opening OP of the insulating layer disposed on the common voltage line 741 is indicated by a dotted line. In addition, in FIG. 6, a shape of the second layer 741B formed in the undercut structure is indicated by a dotted line.

FIG. 7 illustrates the common voltage line 741 of FIG. 6 from another angle. As illustrated in FIG. 7, the common voltage line 741 according to the present embodiment has a deep undercut structure.

FIG. 8 illustrates a contact between the common voltage line 741 and the second electrode 270 in a cross-section cut along line VIII-VIII' of FIG. 7. Referring to FIG. 8, the second layer 741B has an undercut structure further etched by a first distance D than the first layer 741A. In this case, a length D of the undercut may be longer than a height H of the common voltage line 741. That is, the relationship of the undercut length D>the height H of the common voltage line 741 may be satisfied. Since the undercut length D is greater than the height H of the common voltage line 741, the second electrode 270 may contact the upper surface of the first layer 741A, not the side surface of the second layer 741B of the common voltage line 741.

FIG. 8 illustrates a configuration in which the common voltage line 741 and the second electrode 270 are in direct contact with each other on the upper surface of the first layer 741A. Compared with the existing FIG. 3, it can be seen that the contact area between the second electrode 270 and the common voltage line 741 is wide. In addition, even when the oxide layer 500 is disposed on the side surface of the second layer 741B, contact characteristics of the second electrode 270 and the common voltage line 741 may not be affected. Accordingly, the second electrode 270 may stably receive the common voltage.

In this case, referring to FIG. 6, the length D of the undercut portion may be about 5% to about 90% of a width K of the common voltage line 741. That is, when the width of the common voltage line is K, the length D of the undercut portion may be $0.05K<D<0.9K$. When the length D of the undercut portion is smaller than 0.05K, the second electrode 270 may not come into contact with the upper surface of the first layer 741A of the common voltage line 741, but may come into contact with the side surface of the second layer 741B. In addition, when the length D of the undercut portion is greater than 0.9K, the common voltage line 741 may not be stably supported because the width of the second layer 741B, which amounts to the difference between the width K and the length D, becomes excessively narrow. Here, the length D of the undercut portion is measured in the same direction as the width K of the common voltage line 741.

FIG. 6 to FIG. 8 illustrate a configuration in which the width K of the common voltage line 741 is generally the same in each area, but the width K of the common voltage line 741 may be different for each area according to embodiments.

Figure 9:
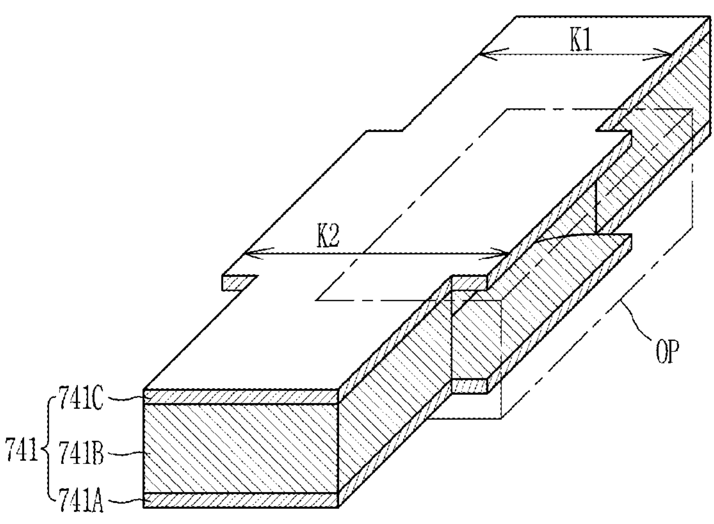
FIG. 9 illustrates a common voltage line according to another embodiment.

FIG. 9 illustrates the common voltage line 741 according to another embodiment. Referring to FIG. 9, a width K2 of the common voltage line 741 may increase in an area of the opening OP where contact with the second electrode 270 is made. That is, the width K1 of the common voltage line 741 in an area other than the opening OP of the insulating layer may be smaller than the width K2 of the common voltage line 741 in an area overlapping the opening OP. As such, when the width of the common voltage line 741 is further increased in a contact area with the second electrode 270, the undercut structure of the second layer 741B may be better formed.

Figure 10:
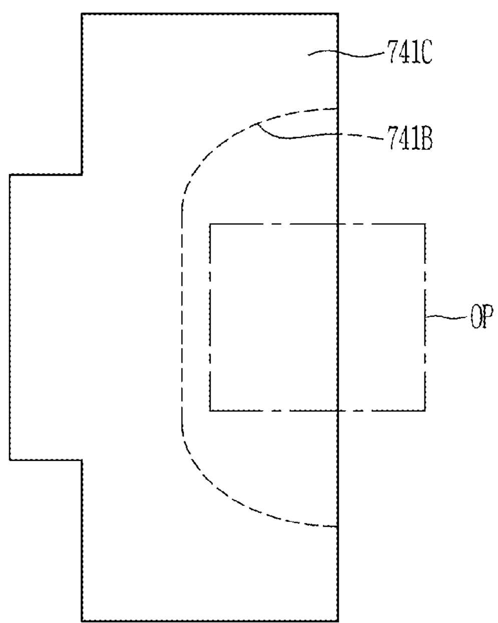
FIG. 10 to FIG. 12 illustrate various shapes of a common voltage line.
Figure 11:
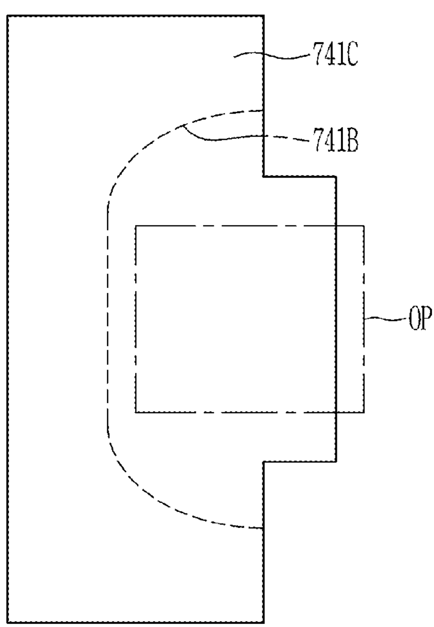
Figure 12:
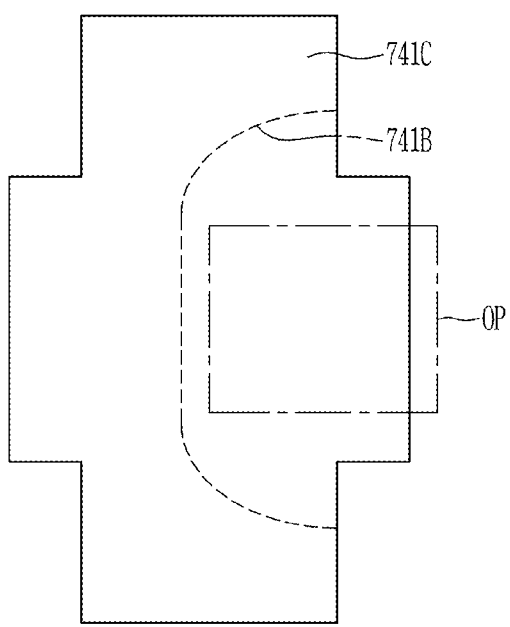

FIG. 10 to FIG. 12 illustrate various shapes of the common voltage line 741. FIG. 10 to FIG. 12 each illustrate a plan view of a shape of the third layer 741C, and the second layer 741B is indicated by dotted lines. Also illustrated is the opening OP of the insulating layer. FIG. 10 illustrates an embodiment that the width of the third layer 741C increases at an opposite side of a side where the undercut is formed, and FIG. 11 illustrates an embodiment that the width of the third layer 741C increases in the side where the undercut is formed. Alternatively, FIG. 12 illustrates an embodiment that the width of the third layer 741C increases at both the side where the undercut is formed and the opposite side thereof.

Figure 13:
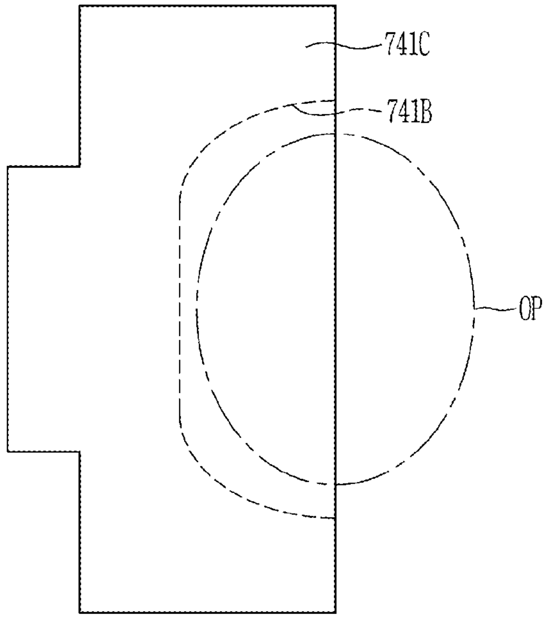
FIG. 13 to FIG. 15 illustrate various shapes of a common voltage line.
Figure 14:
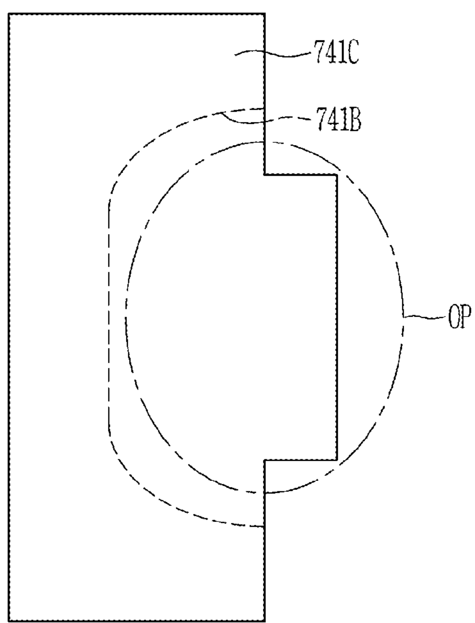
Figure 15:
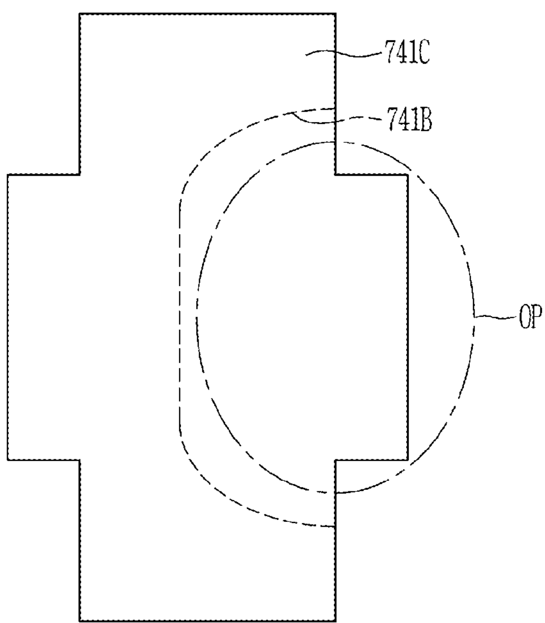

In addition, although the shape of the opening OP is quadrangular in FIGS. 10 to 12, the shape of the opening OP may be circular according to another embodiment. FIG. 13 to FIG. 15 illustrate embodiments in which the shape of the opening OP is changed from a quadrangular shape to a circular shape in a plan view with respect to the embodiments of FIG. 10 to FIG. 12. A detailed description of the same constituent elements will be omitted.

Figure 16:
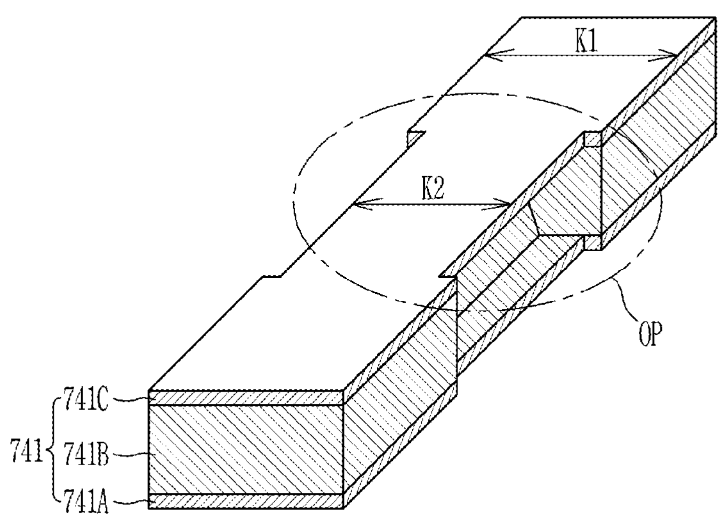
FIG. 16 illustrates a common voltage line according to still another embodiment.

In addition, in the previous embodiment, the configuration in which the width of the common voltage line 741 increases in the contact area with the second electrode 270 has been described, but the width of the common voltage line 741 may be reduced in the contact area with the second electrode 270 according to another embodiment. FIG. 16 illustrates a shape of the common voltage line 741 according to another embodiment. Referring to FIG. 16, in the present embodiment, the width K2 of the common voltage line 741 in the area where the opening OP is defined may be narrower than the width K1 in the area where the opening OP is not defined.

In addition, in the above embodiment, the undercut structure is formed in one direction (e.g., one side) of the common voltage line 741, but this is only an example, and the undercut structure may be positioned in opposite directions of the common voltage line 741. FIG. 16 illustrates the common voltage line 741 according to still another embodiment. Referring to FIG. 16, the undercut structure of the common voltage line 741 is formed at opposite sides (the left side and right side in FIG. 16).

Figure 17:
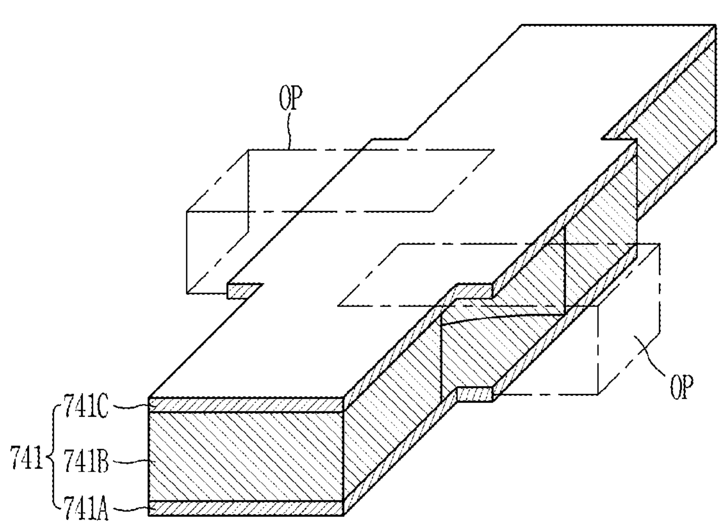
FIG. 17 illustrates a common voltage line according to yet another embodiment.
Figure 18:
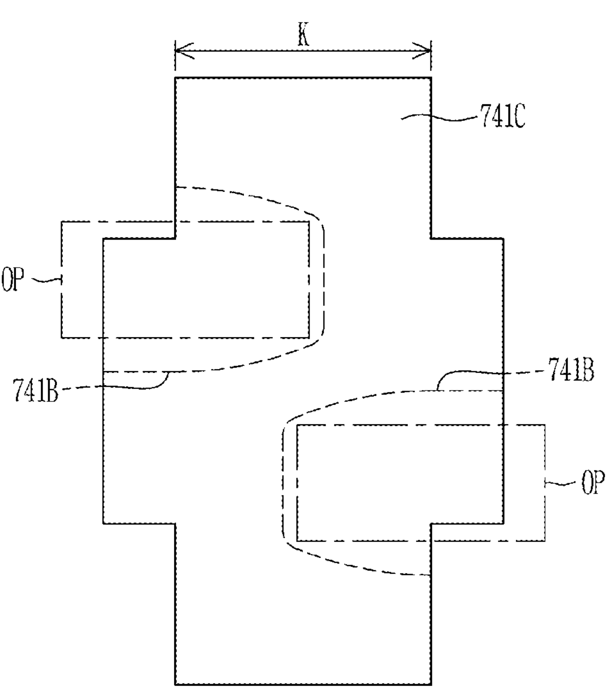
FIG. 18 illustrates an upper surface of the common voltage line according to the embodiment of FIG. 17.

FIG. 17 illustrates the common voltage line 741 according to yet another embodiment. Referring to FIG. 17, in the common voltage line 741 according to the present embodiment, an undercut structure is formed at opposite sides of the common voltage line 741, and such undercut structures are alternately formed. FIG. 18 illustrates an upper surface of the common voltage line 741 according to the embodiment of FIG. 17. FIG. 18 illustrates the third layer 741C, and a shape of the second layer 741B is indicated by dotted lines.

Referring to FIG. 18, in the present embodiment, an undercut shape of the second layer 741B is formed at opposite sides of the common voltage line 741, and they are formed to cross each other. When the undercut shapes defined at opposite sides of the common voltage line 741 are not crossed each other, each of the undercut shapes may not be longer than half of the width K of the common voltage line 741, but when alternately formed as in FIG. 18, the length D of the undercut may be longer than half of the width K of the common voltage line 741. Accordingly, the contact area between the second electrode 270 and the common voltage line 741 may be widened to achieve stable contact can be achieved. Accordingly, the second electrode 270 may stably supply the common voltage.

Hereinafter, a pixel of a display device according to an embodiment of the present disclosure will be described in detail with reference to the drawings. A structure described below are only examples and the present disclosure is not limited thereto. For convenience of description, a pixel where the common voltage line 741 is positioned has been described.

Figure 19:
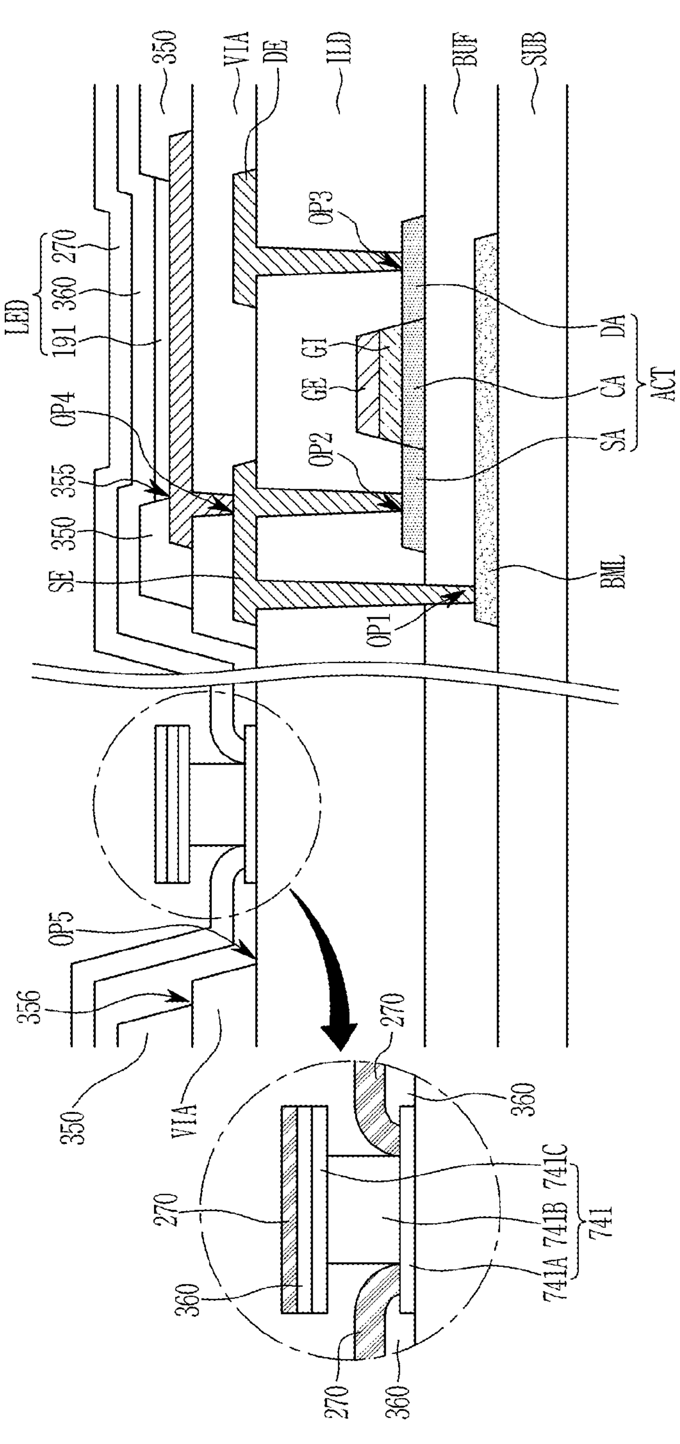
FIG. 19 schematically illustrates a cross-section of a pixel of a display device according to an embodiment.

FIG. 19 schematically illustrates a cross-section of a pixel of a display device according to an embodiment. Referring to FIG. 19, the substrate SUB is positioned. The substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, or cellulose acetate propionate. The substrate SUB may be a rigid substrate or a flexible substrate capable of bending, folding, rolling, or the like. The substrate SUB may be a single layer or a multilayer. In the substrate SUB, at least one base layer including a polymer resin sequentially stacked and at least one inorganic layer may be alternately stacked A light blocking layer BML is positioned on the substrate SUB. The light blocking layer BML may include aluminum (Al), silver (Ag), magnesium (Mg), gold (Au), nickel (Ni), chromium (Cr), calcium (Ca), molybdenum (Mo), titanium (Ti), tungsten (W), and/or copper (Cu) and a metal oxide, and may have a single or multi-layered structure including the same.

A buffer layer BUF is positioned on the light blocking layer BML. The buffer layer BUF may include a silicon oxide ($SiO_x$), a silicon nitride ($SiN_x$), a silicon oxynitride ($SiO_xN_y$), or amorphous silicon (Si).

The buffer layer BUF may define a first opening OP1 therein overlapping the light blocking layer BML. In the first opening OP1, a source electrode SE may be connected to the light blocking layer BML.

The semiconductor layer ACT may include a channel area CA overlapping the gate electrode GE, and a source area SA and a drain area DA positioned at opposite sides of the channel area CA.

A gate insulating layer GI1 may be disposed on the semiconductor layer ACT. The gate insulating layer GI may include a silicon oxide ($SiO_x$), a silicon nitride ($SiN_x$), or a silicon oxynitride ($SiO_xN_y$), and may have a single or multi-layered structure including the same.

The gate insulating layer GI may be positioned to overlap the channel area CA of the semiconductor layer ACT. A gate conductive layer including a gate electrode GE may be positioned on the gate insulating layer GI. The gate conductive layer may include molybdenum (Mo), aluminum (Al), copper (Cu), titanium (Ti), and a metal oxide, and may have a single or multi-layered structure including the same.

The gate electrode GE may be formed in the same process as the gate insulating layer GI to have the same planar shape. The gate electrode GE may be positioned to overlap the semiconductor layer ACT in a direction that is perpendicular to a surface of the substrate SUB.

An interlayer-insulating layer ILD may be disposed on the semiconductor layer ACT and the gate electrode GE. The interlayer-insulating layer ILD may include a silicon oxide ($SiO_x$), a silicon nitride ($SiN_x$), or a silicon oxynitride ($SiO_xN_y$), and may have a single or multi-layered structure including the same. When the interlayer-insulating layer ILD has a multi-layered structure including a silicon nitride and a silicon oxide, a layer including a silicon nitride may be disposed closer to the substrate SUB than a layer including a silicon oxide.

The interlayer-insulating layer ILD may define a first opening OP1 therein overlapping the light blocking layer BML, a second opening OP2 therein overlapping the source area SA of the semiconductor layer ACT, and a third opening OP3 therein overlapping the drain area DA.

A data conductive layer including the source electrode SE, the drain electrode DE, and the common voltage line 741 is disposed on the interlayer-insulating layer ILD. The data conductive layer may include aluminum (Al), silver (Ag), magnesium (Mg), gold (Au), nickel (Ni), chromium (Cr), calcium (Ca), molybdenum (Mo), titanium (Ti), tungsten (W), and/or copper (Cu) and a metal oxide thereof, and may have a single or multi-layered structure including the same. Referring to FIG. 19, the common voltage line 741 has a multi-layered structure including a first layer 741A, a second layer 741B, and a third layer 741C. In FIG. 19, for convenience of description, a portion where the common voltage line 741 is positioned is enlarged and illustrated. A description of the common voltage line 741 is the same as described above. That is, the second layer 741B may have a more etched undercut structure than the first layer 741A and the third layer 741C. As will be described later, the second electrode 270 may contact the common voltage line 741 through such an undercut structure.

The source electrode SE may contact the light blocking layer BML in the first opening OP1, and may contact the source area SA of the semiconductor layer ACT in the second opening OP2. The drain electrode DE may contact the drain area DA of the semiconductor layer ACT in the third opening OP3.

An insulating layer VIA is positioned on the data conductive layer. The insulating layer VIA may include an organic insulating material such as a general purpose polymer, e.g., poly(methyl methacrylate) ("PMMA") or polystyrene ("PS"), a polymer derivative having a phenolic group, an acrylic polymer, an imide polymer, a polyimide, a siloxane polymer, etc.

The insulating layer VIA may define a fourth opening OP4 therein overlapping the source electrode SE and a fifth opening OP5 therein overlapping the common voltage line 741. A first electrode 191 may be positioned on the insulating layer VIA. A partition wall 350 is positioned on the insulating layer VIA and the first electrode 191. The partition wall 350 may define an opening 355 therein overlapping the first electrode 191 and an opening 356 therein overlapping the fifth opening OP5. An emission layer 360 may be positioned on the first electrode 191 and the partition wall 350. A second electrode 270 may be positioned on the emission layer 360. The first electrode 191, the emission layer 360, and the second electrode 270 may constitute a light emitting diode LED.

As illustrated in FIG. 19, the second electrode 270 and the common voltage line 741 are in contact with each other at the fifth opening OP5 to transfer the common voltage to the second electrode 270. As described above, the second electrode 270 may contact the upper surface of the first layer 741A by the undercut structure of the common voltage line 741. Descriptions of the specific contact form the length of the undercut structure and the shape of the common voltage line 741 are the same as those of the previous embodiment, and thus are omitted.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
a substrate including a display area and a non-display area;
an external common voltage line disposed in the non-display area;
a common voltage line disposed in the display area and connected to the external common voltage line;
a plurality of pixels positioned in the display area, each of which includes a first electrode and an emission layer; and
a second electrode positioned on the pixels,
wherein the common voltage line has a multi-layered structure including a first layer, a second layer, and a third layer,
the second layer defines an undercut structure therein,
a width of the second layer is narrower than a width of each of the first layer and the third layer, and
a length of an undercut of the undercut structure is greater than a thickness of the common voltage line.

2. The display device of claim 1, wherein
the length of the undercut is about 5% to about 90% of a width of the common voltage line.

3. The display device of claim 1, wherein
the second layer of the common voltage line includes a material that is different from a material of the first layer and the third layer.

4. The display device of claim 1, wherein
the first layer of the common voltage line is positioned closer to the substrate than the third layer, and
the common voltage line and the second electrode directly contact each other on an upper surface of the first layer.

5. The display device of claim 4, further comprising
an organic layer disposed between the common voltage line and the second electrode.

6. The display device of claim 5, wherein
the organic layer is disposed between the third layer of the common voltage line and the second electrode.

7. The display device of claim 5, wherein
an edge region of the second electrode is directly disposed on the upper surface of the first layer of the common voltage line.

8. The display device of claim 1, further comprising
a source electrode and a drain electrode positioned in the display area,
wherein the common voltage line is positioned in a same layer as a layer of the source electrode and the drain electrode.

9. The display device of claim 1, further comprising
an insulating layer disposed on the common voltage line,
wherein the insulating layer defines an opening therein overlapping the undercut.

10. The display device of claim 9, wherein
a shape of the opening is a quadrangle or a circle in a plan view.

11. The display device of claim 1, wherein
the third layer of the common voltage line includes a side protruding into an area where the undercut is positioned in a plan view.

12. The display device of claim 1, wherein
the third layer of the common voltage line includes a protruding portion on a side opposite to a side where the undercut is positioned in a plan view.

13. The display device of claim 1, wherein
the third layer of the common voltage line includes a side protruding to an area where the undercut is positioned and an opposite side protruding to where the undercut is not positioned in a plan view.

14. The display device of claim 1, wherein
a width of the common voltage line in an area where the undercut of the second layer is positioned is narrower than a width of the common voltage line in an area where the undercut is not positioned.

15. The display device of claim 1, wherein
the undercut structure is defined on one side of the common voltage line.

16. The display device of claim 1, wherein
the undercut structure is defined at opposite sides of the common voltage line.

17. The display device of claim 16, wherein
the undercut structure is defined in a zigzag pattern at the opposite sides of the common voltage line.

18. The display device of claim 17, wherein
the length of the undercut is longer than half of a width of the third layer of the common voltage line.

19. The display device of claim 17, wherein
the undercut structure, which is positioned on a first side surface of the common voltage line, and the undercut structure, positioned on a second side surface of the common voltage line, do not meet each other.

20. The display device of claim 1, wherein
the second electrode contacts the external common voltage line in the non-display area.

* * * * *